United States Patent
Kiran et al.

(10) Patent No.: US 8,390,488 B2
(45) Date of Patent: Mar. 5, 2013

(54) NON-LINEARITY CORRECTION THAT IS INDEPENDENT OF INPUT COMMON MODE, TEMPERATURE VARIATION, AND PROCESS VARIATION

(75) Inventors: Ganesh Kiran, Bangalore (IN); Visvesvaraya Pentakota, Bangalore (IN); Viswanathan Nagarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 13/196,628

(22) Filed: Aug. 2, 2011

(65) Prior Publication Data
US 2012/0056766 A1    Mar. 8, 2012

(30) Foreign Application Priority Data
Aug. 31, 2010   (IN) ............... 2529/CHE/2010

(51) Int. Cl.
*H03M 1/06* (2006.01)

(52) U.S. Cl. ......... 341/118; 341/120; 341/161; 341/162

(58) Field of Classification Search .................. 341/118, 341/161, 162
See application file for complete search history.

(56) References Cited

U.S. PATENT DOCUMENTS

| | | | | |
|---|---|---|---|---|
| 4,908,621 | A * | 3/1990 | Polonio et al. | 341/120 |
| 7,592,938 | B2 * | 9/2009 | Hsueh et al. | 341/118 |
| 7,612,703 | B2 * | 11/2009 | Chen et al. | 341/172 |
| 7,663,516 | B1 * | 2/2010 | Chandra | 341/120 |
| 2010/0259302 | A1 | 10/2010 | Shrivastava | |

* cited by examiner

*Primary Examiner* — Khai M Nguyen
(74) *Attorney, Agent, or Firm* — Alan A. R. Cooper; Wade J. Brady, III; Frederick J. Telecky, Jr.

(57) ABSTRACT

In pipeline analog-to-digital converters (ADCs) the third harmonic can degrade the performance of the ADC, and conventional circuits that attempt to cancel this third harmonic are oftentimes sensitive to process variation, temperature variation, and common mode variations. Here a correction circuit is provided that includes a compensator that adjusts control voltages for MOS capacitors to generally ensures that the difference between the gate-source voltages and threshold voltages of MOS capacitors is generally maintained across variations of process, temperature, and common mode.

15 Claims, 2 Drawing Sheets

NON-LINEARITY CORRECTION THAT IS INDEPENDENT OF INPUT COMMON MODE, TEMPERATURE VARIATION, AND PROCESS VARIATION

CROSS-REFERENCE TO RELATED APPLICATIONS

This application claims priority from India Patent Application No. 2529/CHE/2010, filed Aug. 31, 2010, which is hereby incorporated by reference for all purposes.

TECHNICAL FIELD

The invention relates generally to pipeline analog-to-digital converters (ADCs) and, more particularly, to non-linearity correction for pipeline ADCs.

BACKGROUND

Referring to FIG. 1 of the drawings, the reference numeral 100 generally designates a conventional sample-and-hold (S/H) circuit with non-linear compensation. Circuit 100 generally comprises an S/H circuit 104, MOS capacitors C1 to CN, a current source 106, and a voltage divider 108. In operation, both the S/H circuit 104 and MOS capacitor C1 to CN receive the input signal IN, and the S/H circuit generates output signal OUT. Each of the MOS capacitors C1 to CN also receive a respective control voltage V1 to VN from divider 108 (which is supplied by current source 106 and generally comprises resistors R1 through RM coupled in series with one another). Application of these control voltages V1 to VN to MOS capacitors C1 to CN control the capacitance versus voltage profiles of capacitors C1 to CN so as to allow the current to be drawn (which is depending on the amplitude of signal IN). This current can then be used to compensate for the input dependent amplitude current draw by a downstream ADC or sub-ADC, reducing third harmonic content.

Circuit 100, however, is sensitive to both temperature and process variations. This sensitivity is primarily due to the fact that the control voltages V1 to VN are generated at some nominal process corner, remaining relatively constant, whereas the threshold voltage of MOS capacitors C1 to CN varies with temperature and process. Additionally, because the capacitance profile of the MOS capacitors C1 to CN depends on the difference between the gate-source voltages and threshold voltage, the variation of the gate-source voltages can make circuit 100 sensitive to the common mode of signal IN. Since the nonlinear current draw from a downstream ADC is generally constant with respect to temperature and process variations, the effectiveness of circuit 100 can be limited.

Therefore, there is a need for improved circuit.

SUMMARY

A preferred embodiment of the present invention, accordingly, provides an apparatus is provided. The apparatus comprises a sample-and-hold (S/H) circuit that receives an input signal; and a correction circuit having: a plurality of MOS capacitors that are each coupled to the S/H circuit and that each receive the input signal; a compensator that receives a common mode voltage; and a voltage divider that is coupled to the compensator so as to generate a plurality of control voltages relative to the common mode voltage, process variations of the MOS capacitors, and temperature variations of the NMOS capacitors and that is coupled to each of MOS capacitors so as to provide each MOS capacitor with at least one of a plurality of control voltages.

In accordance with a preferred embodiment of the present invention, the compensator further comprises: an amplifier having a first input terminal, a second input terminal, and an output terminal, wherein the first input terminal of the amplifier receives the common mode voltage, and wherein the output terminal of the amplifier is coupled to the voltage divider; a current source that is coupled to the second input terminal of the amplifier; and a feedback circuit that is coupled between the output terminal of the amplifier and the second input terminal of the amplifier.

In accordance with a preferred embodiment of the present invention, the feedback circuit further comprises a diode and a resistor coupled in series with one another.

In accordance with a preferred embodiment of the present invention, the diode further comprises a diode-connected transistor.

In accordance with a preferred embodiment of the present invention, the diode-connected transistor is an NMOS transistor.

In accordance with a preferred embodiment of the present invention, the current source further comprises a first current source, and wherein the apparatus further comprises a second current source that is coupled to the voltage divider.

In accordance with a preferred embodiment of the present invention, the voltage divider further comprises a plurality of resistor coupled in series with one another.

In accordance with a preferred embodiment of the present invention, an apparatus is provided. The apparatus comprises a plurality of analog-to-digital converter (ADC) stages coupled in series with one another in a sequence, wherein the first ADC stage of the sequence includes: a sample-and-hold (S/H) circuit that receives the analog input signal; and a correction circuit having: a plurality of MOS capacitors that are each coupled to the S/H circuit and that each receive the analog input signal; a compensator that receives a common mode voltage; and a voltage divider that is coupled to the compensator so as to generate a plurality of control voltages relative to the common mode voltage, process variations of the MOS capacitors, and temperature variations of the NMOS capacitors and that is coupled to each of MOS capacitors so as to provide each MOS capacitor with at least one of a plurality of control voltages; and a digital output circuit that is coupled to each ADC stage and that outputs a digital output signal.

In accordance with a preferred embodiment of the present invention, each ADC stage further comprises: a sub-ADC that is coupled to an S/H circuit and that is coupled to the digital output circuit; a digital-to-analog converter (DAC) that is coupled to the sub-ADC; an adder that is coupled to the S/H circuit and the DAC so as to output a residue signal; and a residue amplifier that is coupled to the adder.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
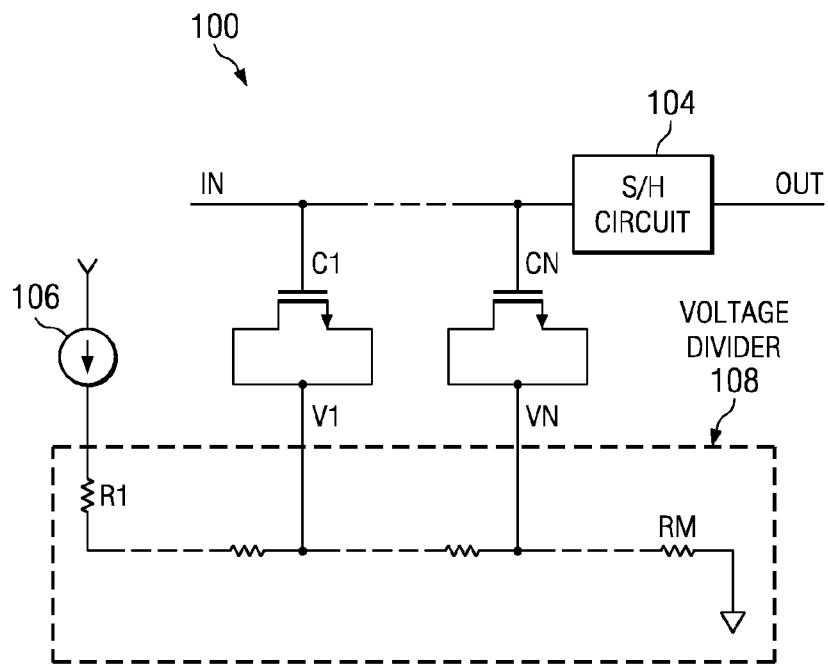
FIG. 1 is a circuit diagram of an example of conventional S/H circuit with non-linear compensation.

Refer now to the drawings wherein depicted elements are, for the sake of clarity, not necessarily shown to scale and wherein like or similar elements are designated by the same reference numeral through the several views.

Figure 2:
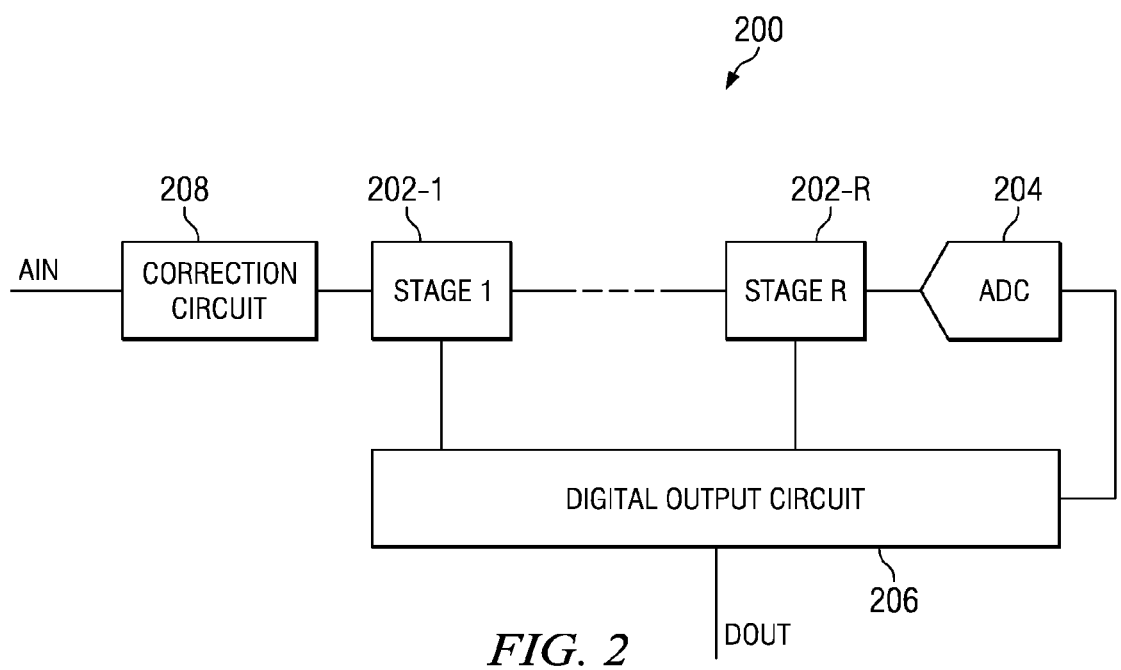
FIG. 2 is a circuit diagram of an example of a pipeline ADC in accordance with a preferred embodiment of the present invention.

Turning to FIG. 2 of the drawings, a pipeline ADC in accordance with a preferred embodiment of the present invention can be seen. ADC 200 generally comprises a pipeline (which generally includes correction circuit 208, stages 202-1 to 202-R and ADC 204) and digital output circuit 206. In operation, the stages 202-1 to 202-R are arranged in a sequence following the correction circuit 208 where each stage 202-1 to 202-R resolves a predetermined number of bits for the analog input signal AIN, and ADC 204 resolves the remaining bits following stage 202-R. The digital output circuit 206 receives these digital output signals from the stages 202-1 to 202-R and ADC 204 so as to generate a digital output signal DOUT.

Figure 3:
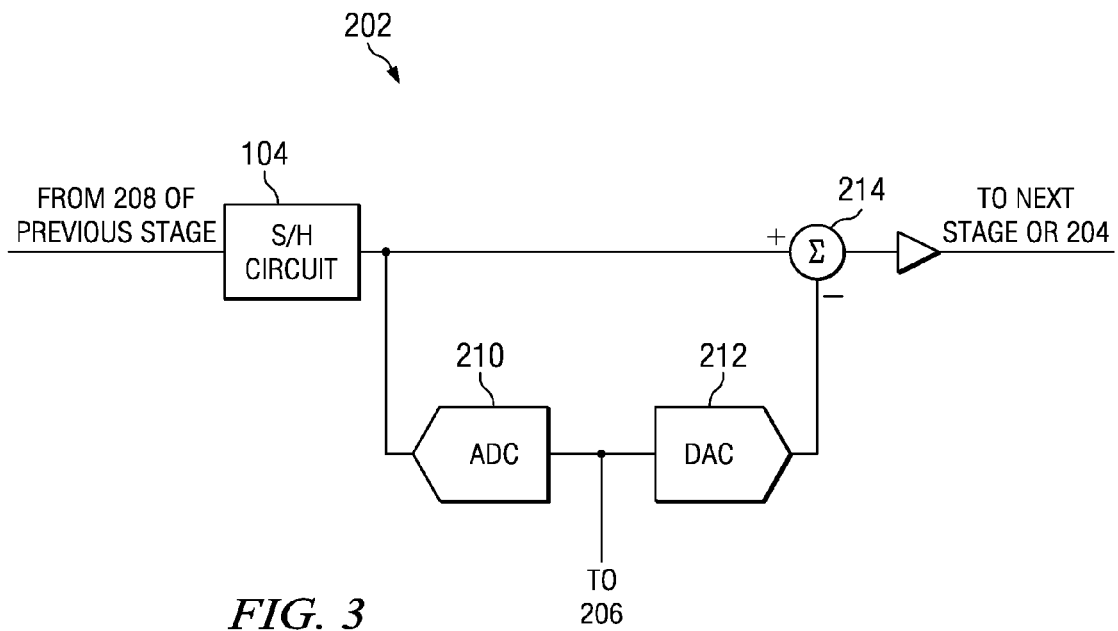
FIG. 3 is a circuit diagram of an example of a stage of the pipeline ADC of FIG. 2.

In FIG. 3, stages 202-1 to 202-R (which are hereinafter referred to as 202) can be seen. In operation, the S/H circuit 104 receives an input signal (which may be the output from correction circuit 208 or a residue signal from a previous stage). The sampled input signal (which is sampled by S/H circuit 104) is then provided to the ADC or sub-ADC 210, which resolves a predetermined number of bits and which provides these resolved bits to the digital output circuit 206. The digital-to-analog converter (DAC) 212 converts these resolved bits to an analog signal, and adder 214 then determines difference between the analog signal (from DAC 212) and the sampled input signal (from S/H circuit 104), which is the reside signal. This residue signal is amplified by amplifier and provided to a subsequent stage (i.e., stage 202-2 to 202-R of FIG. 2) or ADC 204.

Figure 4:
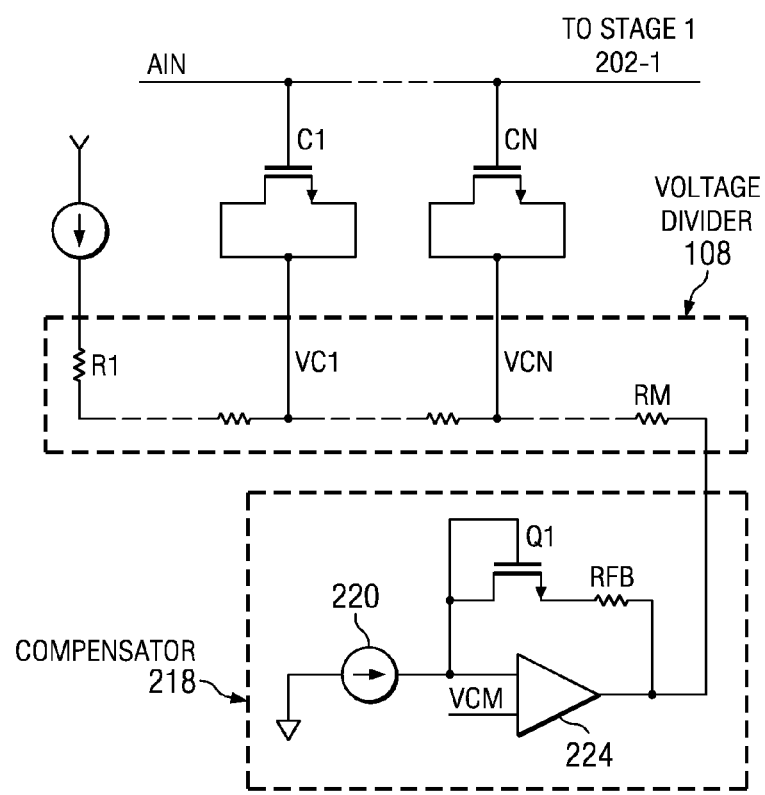
FIG. 4 is a circuit diagram of an example of the correction circuit of the stage of FIG. 3.

Generally, correction circuit 208 and S/H circuit 104 (from stage 202-1) operate in a similar manner to circuit 100; however, correction circuit 208 is configured to compensate for variations in common mode, process, and temperature. Correction circuit 208 (which can be seen in greater detail in FIG. 4) has many of the same features as shown with circuit 100, but, instead of coupling the voltage divider 108 to ground (as shown with circuit 100), a compensator 218 is coupled to the voltage divider 108. This compensator 218 generally comprises an amplifier 224, a current source, an NMOS transistor Q1, and a resistor RFB.

Here, the compensator 218 allows the control voltages VC1 to VCN to be generated relative to a common mode voltage VCM and the characteristics of MOS capacitors C1 to CN. Preferably, a current from current source 220 flows through NMOS transistor Q1 (which is diode-connected) and resistor RFB. The resistance of resistor RFB and the size of NMOS transistor Q1 are chosen such that the voltage VC1 to VCN generally matches the nominal process corner used for circuit 100. However, because NMOS transistor Q1 (which is subject to the same process and temperature variations as NMOS capacitors C1 to CN) is used to generate these control voltages VC1 to VCN, the control voltages VC1 to VCN will generally track the changes in the threshold voltages in NMOS capacitors C1 to CN. Additionally, because the common mode voltage VCM is provided to amplifier 224 (which is also used to generate the control voltages VC1 to VCN), variations in the common mode can be tracked. Therefore, the compensator 218 generally ensures that the difference between the gate-source voltages and threshold voltages of NMOS capacitors C1 to CN is maintained across variations of process, temperature, and common mode.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a sample-and-hold (S/H) circuit that receives an input signal; and
   a correction circuit having:
      a plurality of MOS capacitors that are each coupled to the S/H circuit and that each receives the input signal;
      a compensator that receives a common mode voltage; and
      a voltage divider that is coupled to the compensator so as to generate a plurality of control voltages relative to the common mode voltage, process variations of the MOS capacitors, and temperature variations of the NMOS capacitors and that is coupled to each of MOS capacitors so as to provide each MOS capacitor with at least one of a plurality of control voltages.

2. The apparatus of claim 1, wherein the compensator further comprises:
   an amplifier having a first input terminal, a second input terminal, and an output terminal, wherein the first input terminal of the amplifier receives the common mode voltage, and wherein the output terminal of the amplifier is coupled to the voltage divider;
   a current source that is coupled to the second input terminal of the amplifier; and
   a feedback circuit that is coupled between the output terminal of the amplifier and the second input terminal of the amplifier.

3. The apparatus of claim 2, wherein the feedback circuit further comprises a diode and a resistor coupled in series with one another.

4. The apparatus of claim 3, wherein the diode further comprises a diode-connected transistor.

5. The apparatus of claim 4, wherein the diode-connected transistor is an NMOS transistor.

6. The apparatus of claim 5, wherein the current source further comprises a first current source, and wherein the apparatus further comprises a second current source that is coupled to the voltage divider.

7. The apparatus of claim 6, wherein the voltage divider further comprises a plurality of resistor coupled in series with one another.

8. An apparatus comprising:
- a plurality of analog-to-digital converter (ADC) stages coupled in series with one another in a sequence, wherein the first ADC stage of the sequence includes:
  - a sample-and-hold (S/H) circuit that receives the analog input signal; and
  - a correction circuit having:
    - a plurality of MOS capacitors that are each coupled to the S/H circuit and that each receive the analog input signal;
    - a compensator that receives a common mode voltage; and
    - a voltage divider that is coupled to the compensator so as to generate a plurality of control voltages relative to the common mode voltage, process variations of the MOS capacitors, and temperature variations of the NMOS capacitors and that is coupled to each of MOS capacitors so as to provide each MOS capacitor with at least one of a plurality of control voltages; and
- a digital output circuit that is coupled to each ADC stage and that outputs a digital output signal.

9. The apparatus of claim 8, wherein the compensator further comprises:
- an amplifier having a first input terminal, a second input terminal, and an output terminal, wherein the first input terminal of the amplifier receives the common mode voltage, and wherein the output terminal of the amplifier is coupled to the voltage divider;
- a current source that is coupled to the second input terminal of the amplifier; and
- a feedback circuit that is coupled between the output terminal of the amplifier and the second input terminal of the amplifier.

10. The apparatus of claim 9, wherein the feedback circuit further comprises a diode and a resistor coupled in series with one another.

11. The apparatus of claim 10, wherein the diode further comprises a diode-connected transistor.

12. The apparatus of claim 11, wherein the diode-connected transistor is an NMOS transistor.

13. The apparatus of claim 12, wherein the current source further comprises a first current source, and wherein the apparatus further comprises a second current source that is coupled to the voltage divider.

14. The apparatus of claim 13, wherein the voltage divider further comprises a plurality of resistor coupled in series with one another.

15. The apparatus of claim 14, wherein each ADC stage further comprises:
- a sub-ADC that is coupled to an S/H circuit and that is coupled to the digital output circuit;
- a digital-to-analog converter (DAC) that is coupled to the sub-ADC;
- an adder that is coupled to the S/H circuit and the DAC so as to output a residue signal; and
- a residue amplifier that is coupled to the adder.

* * * * *